US011765861B2

(12) United States Patent
Yang

(10) Patent No.: US 11,765,861 B2
(45) Date of Patent: Sep. 19, 2023

(54) VAPOR CHAMBER STRUCTURE

(71) Applicant: ASIA VITAL COMPONENTS CO., LTD., New Taipei (TW)

(72) Inventor: Hsiu-Wei Yang, New Taipei (TW)

(73) Assignee: ASIA VITAL COMPONENTS CO., LTD., New Taipei (TW)

(*) Notice: Subject to any disclaimer, the term of this patent is extended or adjusted under 35 U.S.C. 154(b) by 0 days.

(21) Appl. No.: 16/403,597

(22) Filed: May 5, 2019

(65) Prior Publication Data

US 2019/0261537 A1    Aug. 22, 2019

Related U.S. Application Data

(63) Continuation-in-part of application No. 13/274,358, filed on Oct. 17, 2011, now abandoned.

(51) Int. Cl.
*F28D 15/02* (2006.01)
*H05K 7/20* (2006.01)
(Continued)

(52) U.S. Cl.
CPC ........... *H05K 7/20327* (2013.01); *G06F 1/20* (2013.01); *H01L 23/3731* (2013.01);
(Continued)

(58) Field of Classification Search
CPC .. F28D 15/0266; F28D 15/0233; F28D 15/04; F28D 15/046; F28D 15/02;
(Continued)

(56) References Cited

U.S. PATENT DOCUMENTS 4,727,455 A * 2/1988 Neidig ................ F28D 15/0233
165/104.33
5,707,715 A * 1/1998 deRochemont ....... H01L 23/142
428/210
(Continued)

FOREIGN PATENT DOCUMENTS

CN      101995182 A     3/2011
JP    2009-236362 A    10/2009
(Continued)

OTHER PUBLICATIONS

Search Report dated Jul. 9, 2013 issued by Taiwan Intellectual Property Office for counterpart application No. 100130954.

*Primary Examiner* — Harry E Arant
(74) *Attorney, Agent, or Firm* — Demian K. Jackson; Jackson IPG PLLC

(57) ABSTRACT

A vapor chamber structure includes a main body formed of a metal plate and a ceramic plate. The metal plate and the ceramic plate are closed to each other to define a chamber therebetween; and the chamber is internally provided with a wick structure, a support structure, and a working fluid. The metal plate and the ceramic plate are connected to each other via welding or a direct bonding copper process, and the support structure is connected to between the metal plate and the ceramic plate also via welding or the direct bonding copper process. By contacting the ceramic plate of the vapor chamber with a heat source packaged in a ceramic material to transfer heat, the problem of crack at an interface between the vapor chamber and the heat source due to thermal fatigue can be overcome.

10 Claims, 10 Drawing Sheets

(51) Int. Cl.
*G06F 1/20* (2006.01)
*H01L 23/373* (2006.01)
*H01L 23/427* (2006.01)

(52) U.S. Cl.
CPC ...... *H01L 23/3733* (2013.01); *H01L 23/3736* (2013.01); *H01L 23/427* (2013.01); *H05K 7/20336* (2013.01); *G06F 2200/201* (2013.01)

(58) Field of Classification Search
CPC .. H05K 7/20; H05K 7/20327; H05K 7/20336; H01L 23/427; H01L 23/3731; H01L 23/3733; H01L 23/3736; G06F 1/20; G06F 2200/201
See application file for complete search history.

(56) References Cited

U.S. PATENT DOCUMENTS

| | | | | |
|---|---|---|---|---|
| 6,082,443 | A * | 7/2000 | Yamamoto | F28D 15/0233 165/104.21 |
| 6,317,322 | B1 * | 11/2001 | Ueki | H01L 23/427 165/80.3 |
| 6,675,881 | B1 * | 1/2004 | Rago | F28D 7/106 165/181 |
| 2002/0056542 | A1 * | 5/2002 | Yamamoto | F28D 15/0233 165/80.3 |
| 2003/0159806 | A1 * | 8/2003 | Sehmbey | F28F 3/027 165/80.3 |
| 2006/0005952 | A1 * | 1/2006 | Yeh | B23P 15/26 165/104.26 |
| 2006/0207750 | A1 * | 9/2006 | Chang | F28D 15/046 165/104.26 |
| 2006/0213648 | A1 * | 9/2006 | Chen | F28D 15/0233 165/104.33 |
| 2007/0295486 | A1 * | 12/2007 | Su | F28D 15/0233 165/104.26 |
| 2008/0040925 | A1 * | 2/2008 | Lee | F28D 15/0233 29/890.03 |
| 2008/0171647 | A1 * | 7/2008 | Lee | C04B 35/581 501/32 |
| 2008/0174963 | A1 * | 7/2008 | Chang | F28D 15/046 361/700 |
| 2009/0025910 | A1 * | 1/2009 | Hoffman | H01L 23/427 165/104.26 |
| 2009/0040726 | A1 * | 2/2009 | Hoffman | F28D 15/0233 361/700 |
| 2010/0078151 | A1 * | 4/2010 | Koenigsberg | F21V 29/83 165/104.26 |
| 2011/0108142 | A1 * | 5/2011 | Liu | H01L 23/427 137/561 R |
| 2011/0108245 | A1 * | 5/2011 | Tan | F28D 15/04 165/104.26 |

FOREIGN PATENT DOCUMENTS

| | | |
|---|---|---|
| TW | 200950629 A | 12/2009 |
| TW | M376120 U | 3/2010 |
| TW | M378614 U | 4/2010 |
| TW | 201033567 A1 | 9/2010 |
| TW | 201041496 A | 11/2010 |
| TW | 201102604 A | 1/2011 |

* cited by examiner

VAPOR CHAMBER STRUCTURE

The present application is a continuation in part of U.S. patent application Ser. No. 13/274,358, filed on Oct. 17, 2011.

FIELD OF THE INVENTION

The present invention relates to a vapor chamber structure, and more particularly to a vapor chamber structure formed of a metal plate and a ceramic plate to overcome the problem of crack at an interface between a vapor chamber and a heat source due to thermal fatigue.

BACKGROUND OF THE INVENTION

The progress in semiconductor technology enables various integrated circuits (ICs) to have a gradually reduced volume. For the purpose of processing more data, the number of computing elements provided on the presently available ICs is several times higher than that on the conventional ICs of the same volume. When the number of computing elements on the ICs increases, the heat generated by the computing elements during the operation thereof also increases. For example, the heat generated by a central processing unit (CPU) at full-load condition is high enough to burn out the whole CPU. Thus, it is always an important issue to properly provide a heat dissipation device for ICs.

The CPU and other chips are heat sources in the electronic device. When the electronic device operates, these heat sources will generate heat. The CPU and other chips are mainly encapsulated with a ceramic material. The ceramic material has a low thermal expansion coefficient close to that of chips used in general electronic devices and is electrically non-conductive, and is therefore widely employed as packaging material and semiconductor material.

On the other hand, a heat dissipation device usually includes a heat dissipating structure made of an aluminum material or a copper material, and is often used along with other heat dissipation elements, such as fans and heat pipes, in order to provide enhanced heat dissipation effect. However, in considering the reliability of the electronic device, the use of a heat dissipation structure with cooling fans and heat pipes would usually have adverse influence on the overall reliability of the electronic device.

Generally speaking, a heat dissipation device with simpler structural design would be better to the overall reliability of the electronic device. Thus, the heat transfer efficiency of the electronic device can be directly improved when the heat dissipation device used therewith uses a material having better heat transferring and radiating ability than copper.

In addition, heat stress is another potential factor having adverse influence on the reliability of the electronic device in contact with the heat dissipation device. The heat source, such as the chip in the CPU, has a relatively low thermal expansion coefficient. To pursue good product reliability, the electronic device manufacturers would usually use a ceramic material with low thermal expansion coefficient, such as aluminum nitride (AlN) or silicon carbide (SiC), to package the chip. Further, in the application field of light-emitting diode (LED) heat dissipation, for example, aluminum and copper materials forming the heat dissipation device have thermal expansion coefficients much higher than that of an LED sapphire chip and the ceramic packaging material thereof. In a high-brightness LED, an interface between the aluminum or copper material of the heat dissipation device and the ceramic packaging material of the LED sapphire chip tends to crack due to thermal fatigue caused by the difference in the thermal expansion coefficients thereof when the LED has been used over a long period of time. The interface crack in turn causes a rising thermal resistance at the interface. For the high-brightness LED products, the rising thermal resistance at the heat dissipation interface would result in heat accumulation to cause burnout of the LED chip and bring permanent damage to the LED.

In brief, the difference between the thermal expansion coefficients of the ceramic packaging material of a heat source and the metal material of a heat dissipation device would cause crack at an interface between the heat source and the heat dissipation device due to thermal fatigue; and it is necessary to work out a way to solve the problem of such crack at the interface.

SUMMARY OF THE INVENTION

A primary object of the present invention is to provide a vapor chamber structure that overcomes the problem of crack at an interface between the vapor chamber and a heat source due to thermal fatigue.

To achieve the above and other objects, the vapor chamber structure according to the present invention includes a main body formed of a metal plate and a ceramic plate. The metal plate and the ceramic plate are correspondingly closed to each other to thereby together define a chamber therebetween. The chamber is internally provided with a wick structure, a support structure, and a working fluid. The wick structure is located on inner wall surfaces of the chamber, and the support structure is connected to between the metal plate and the ceramic plate.

The wick structure is selected from the group consisting of a sintered powder structure, a netlike structure, and a plurality of grooves. The ceramic plate is made of a material selected from the group consisting of silicon nitride ($Si_3N_4$), zirconium nitride ($ZrO_2$), and aluminum oxide ($Al_2O_3$). And, the support structure includes a plurality of copper posts.

The support structure is connected to the ceramic plate in a manner selected from the group consisting of soldering, brazing, diffusion bonding, ultrasonic welding, and direct bonding copper (DBC) process.

According to the present invention, a ceramic plate is applied in the vapor chamber structure to connect to a metal plate, and it is the ceramic plate of the vapor chamber that is in contact with a heat source packaged in a ceramic material. Since the ceramic plate of the vapor chamber structure and the ceramic packaging material of the heat source are close in their thermal expansion coefficients, it is able to avoid the problem of crack at an interface between the vapor chamber and the heat source due to thermal fatigue caused by different thermal expansion coefficients of the vapor chamber and the heat source.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 1b is an assembled view of FIG. 1a;

DETAILED DESCRIPTION OF THE PREFERRED EMBODIMENTS

Figure 1A:
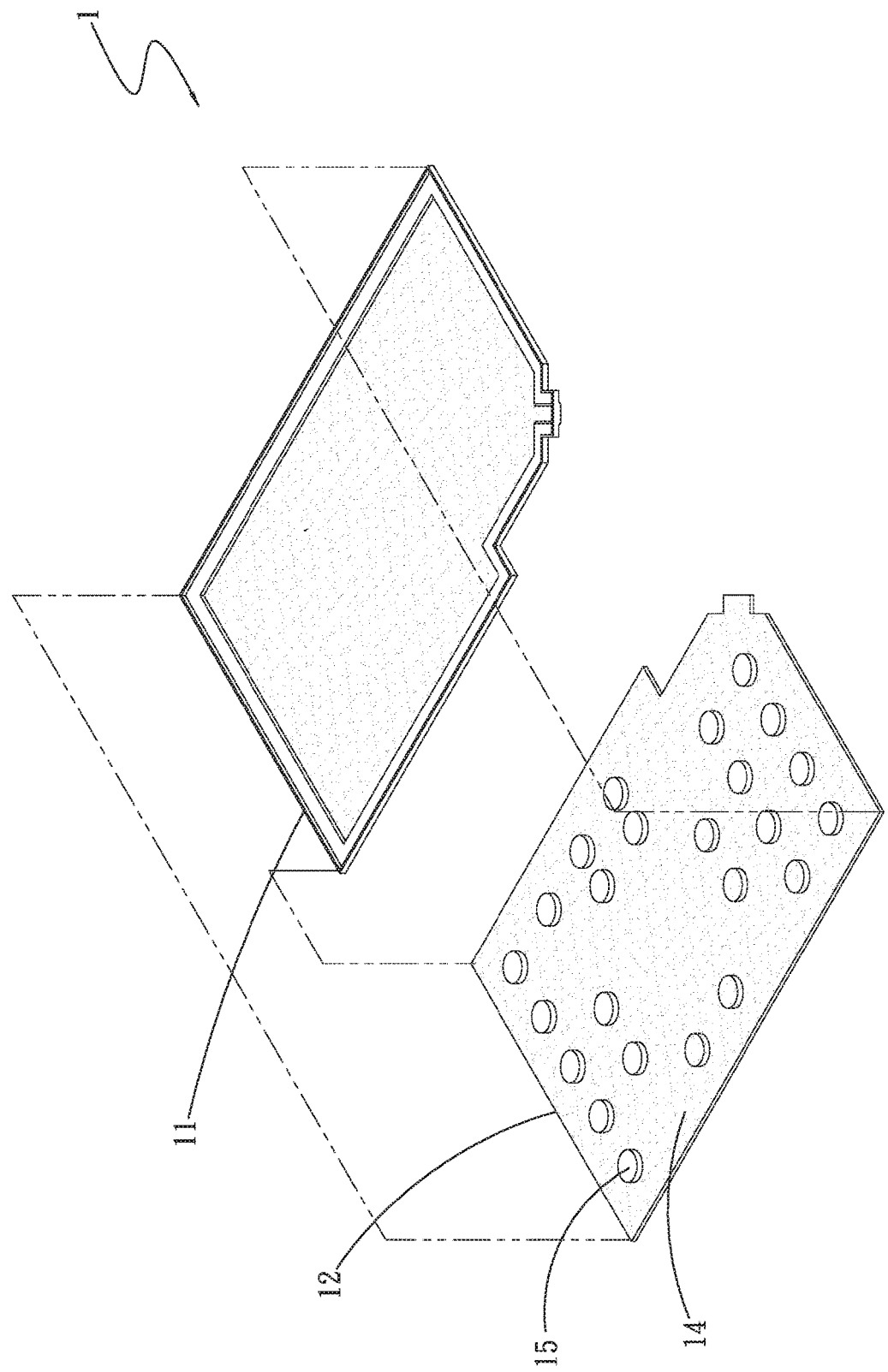
FIG. 1a is an exploded perspective view of a vapor chamber structure according to a first embodiment of the present invention.

The present invention will now be described with some preferred embodiments thereof and with reference to the accompanying drawings. For the purpose of easy to understand, elements that are the same in the preferred embodiments are denoted by the same reference numerals.

Figure 1B:
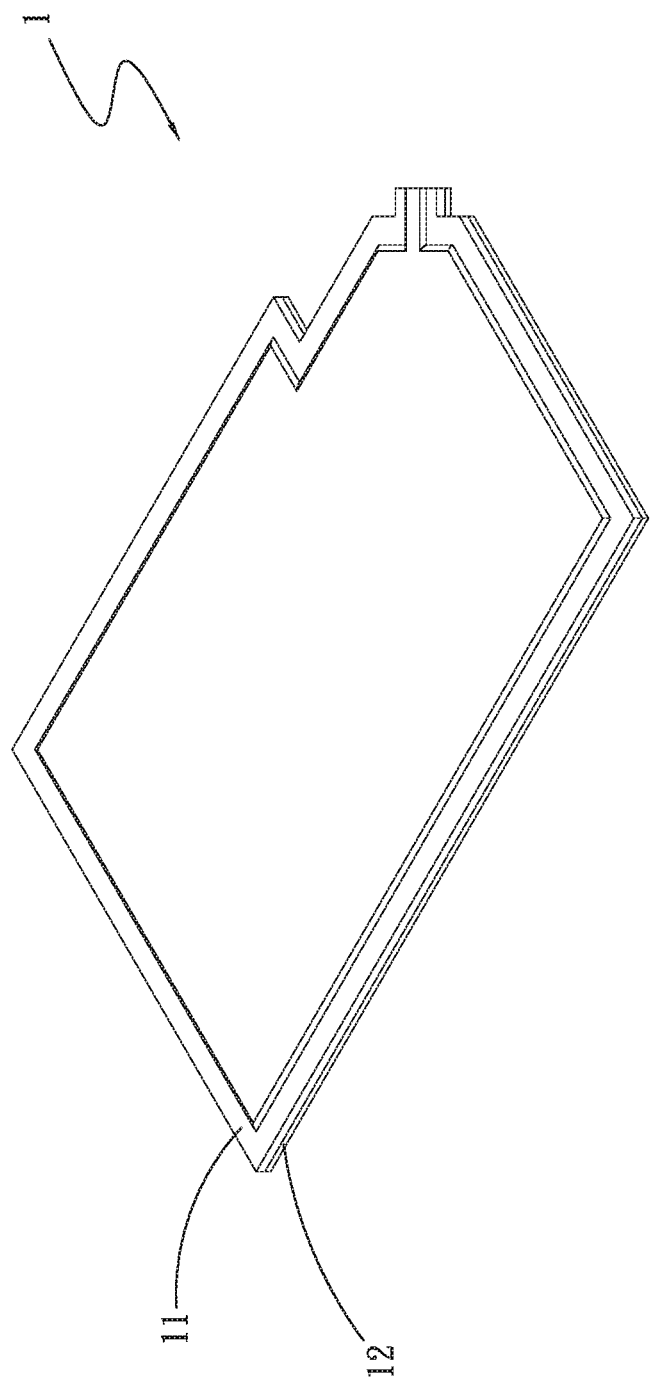
Figure 2:
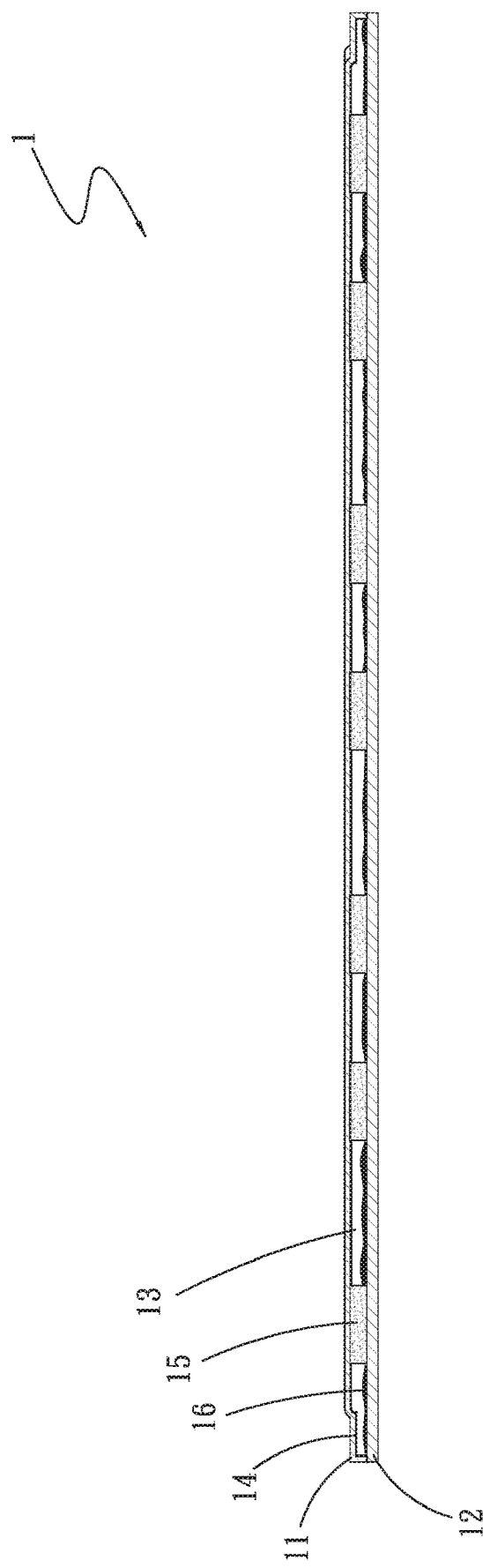
FIG. 2 is a cross sectional view of the vapor chamber structure according to the first embodiment of the present invention.
Figure 2A:
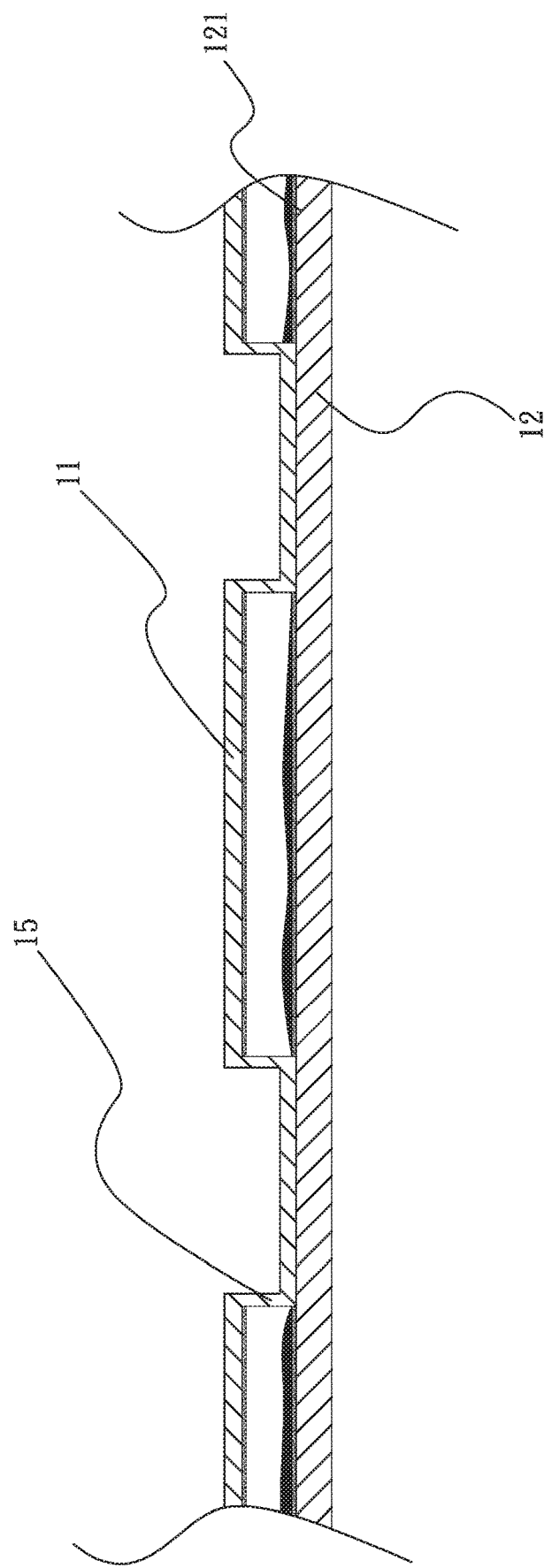
FIG. 2a is a view of the support structure of the vapor chamber structure of the present invention.
Figure 2B:
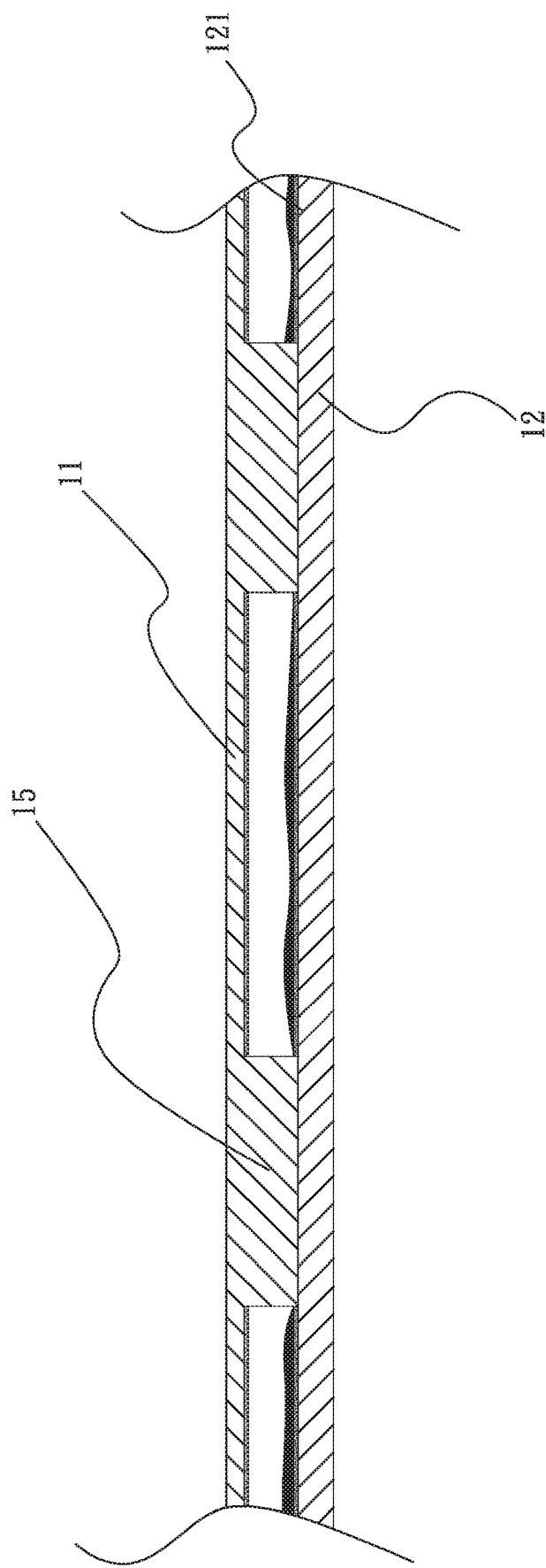
FIG. 2b is a view of the support structure of the vapor chamber structure of the present invention.
Figure 2D:
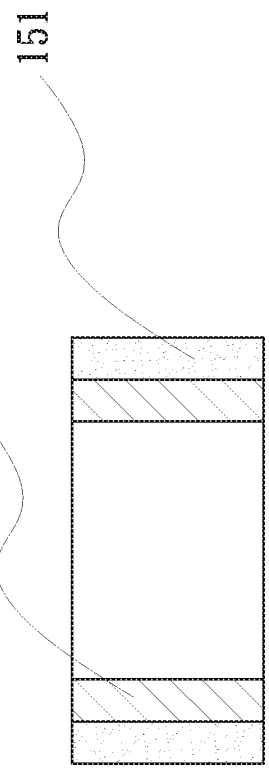
FIG. 2d is a view of the support structure of the vapor chamber structure of the present invention.
Figure 2C:
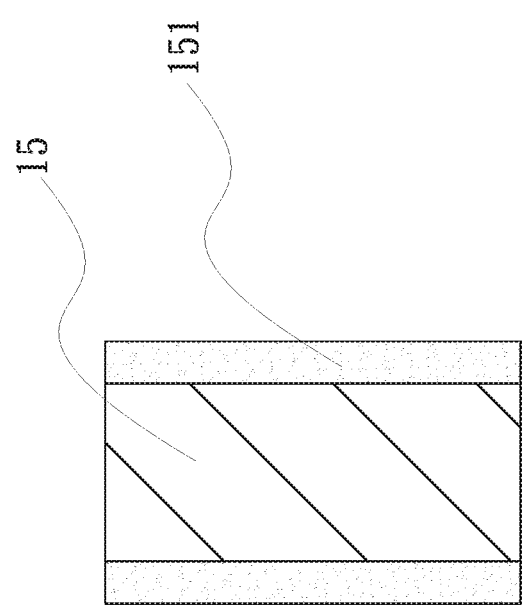
FIG. 2c is a view of the support structure of the vapor chamber structure of the present invention.
Figure 2F:
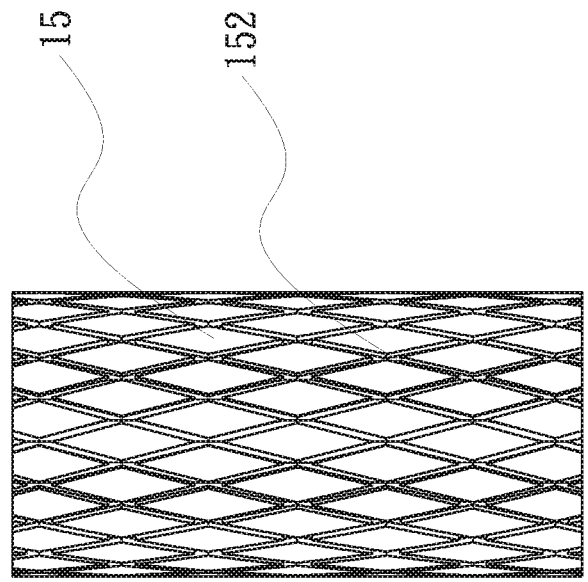
FIG. 2f is a view of the support structure of the vapor chamber structure of the present invention.
Figure 2E:
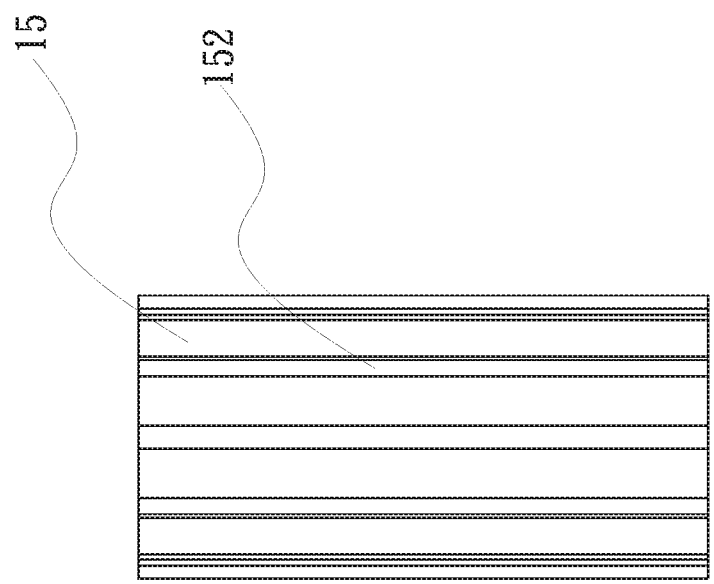
FIG. 2e is a view of the support structure of the vapor chamber structure of the present invention.

Please refer to FIGS. 1a, 1b, 2, 2a, 2b, 2c, 2d, 2e and 2f. FIG. 1a is an exploded perspective view of a vapor chamber structure according to a first embodiment of the present invention. FIG. 1b is an assembled view of FIG. 1a. FIG. 2 is a cross sectional view of the vapor chamber structure according to the first embodiment of the present invention. FIG. 2a is a view of the support structure of the vapor chamber structure of the present invention. FIG. 2b is a view of the support structure of the vapor chamber structure of the present invention. FIG. 2c is a view of the support structure of the vapor chamber structure of the present invention. FIG. 2d is a view of the support structure of the vapor chamber structure of the present invention. FIG. 2e is a view of the support structure of the vapor chamber structure of the present invention. FIG. 2f is a view of the support structure of the vapor chamber structure of the present invention. As shown, the vapor chamber structure in the first embodiment includes a main body 1.

The main body 1 is formed of a metal plate 11 and a ceramic plate 12, which are correspondingly closed to each other to thereby together define a chamber 13 therebetween. The chamber 13 is internally provided with a wick structure 14 and a support structure 15. The wick structure 14 is located on inner walls of the chamber 13, and the support structure 15 is located between and connected to the metal plate 11 and the ceramic plate 12. A working fluid 16 is filled into the chamber 13.

In the illustrated first embodiment of the present invention, the wick structure 14 includes, but not limited to, a sintered powder structure.

The ceramic plate 12 can be made of silicon nitride ($Si_3N_4$), zirconium nitride ($ZrO_2$), or aluminum oxide ($Al_2O_3$).

The support structure 15 includes a plurality of copper posts that are connected to the ceramic plate 12 by way of soldering, brazing, diffusion bonding, ultrasonic welding, or direct bonding copper (DBC) process.

In addition, the support structure 15 can be alternatively formed on one face of the metal plate 11 by way of punching processing to protrude toward the ceramic plate 12 (as shown in FIG. 2a).

Alternatively, the support structure 15 can be alternatively formed on one face of the metal plate 11 by way of cutting processing, laser processing or etching as a protrusion structure to protrude toward the ceramic plate 12 and abut against and support the ceramic plate 12 (as shown in FIG. 2b).

The support structure 15 is a copper post or a hollow collar body. In addition to copper, the support structure 15 can be also made of a material selected from a group consisting of aluminum, iron, stainless steel, ceramic material, commercial pure titanium, titanium alloy, copper alloy and aluminum alloy. A porous structure layer 151 formed of sintered powder can be disposed on outer side of the copper post or the hollow collar body (as shown in FIGS. 2c and 2d).

Alternatively, in the case that the support structure 15 is selectively a copper post or a hollow collar body, an outer surface of the copper post or the hollow collar body is formed with multiple grooves 152. The grooves 152 extend in a direction parallel to the axial direction of the support structure 15 (as shown in FIG. 2e) or unparallel to the axial direction of the support structure 15 or intersecting each other or not intersecting each other (as shown in FIG. 2f). The widths of two ends of the grooves 152 are equal to or unequal to each other.

The metal plate 11 is made of a copper material, an aluminum material, a stainless steel material, or any other metal material with good heat radiating and thermal conducting properties. The material with good thermal conducting properties is commercial pure titanium or titanium alloy.

Figure 3:
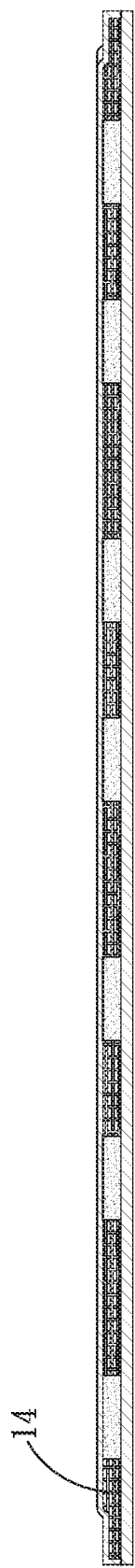
FIG. 3 is a cross sectional view of a vapor chamber structure according to a second embodiment of the present invention.

Please refer to FIG. 3 that is a cross sectional view of a vapor chamber structure according to a second embodiment of the present invention. As shown, the second embodiment is generally structurally similar to the first embodiment, except that the wick structure 14 in the second embodiment includes but not limited to a netlike structure. The netlike structure is made of a material selected from a group consisting of copper, aluminum, stainless steel, commercial pure titanium and titanium alloy. In the case that the wick structure 14 is a one-piece structure such as netlike body or sintered powder body, the wick structure 14 can be composed of multiple layers overlapped with each other. In addition, the wick structure 14 can be made of the same material or a combination of different materials.

Figure 4:
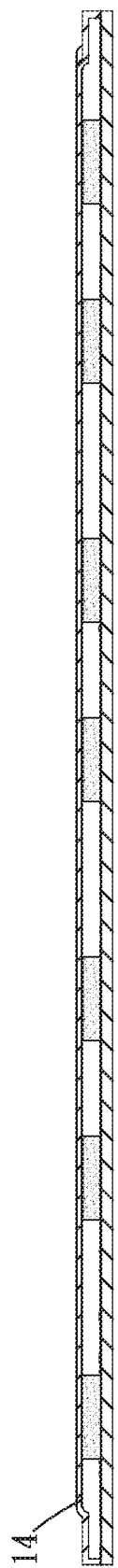
FIG. 4 is a cross sectional view of a vapor chamber structure according to a third embodiment of the present invention.

FIG. 4 is a cross sectional view of a vapor chamber structure according to a third embodiment of the present invention. As shown, the third embodiment is generally structurally similar to the first embodiment, except that the wick structure 14 in the third embodiment includes but not limited to a plurality of grooves.

Figure 5:
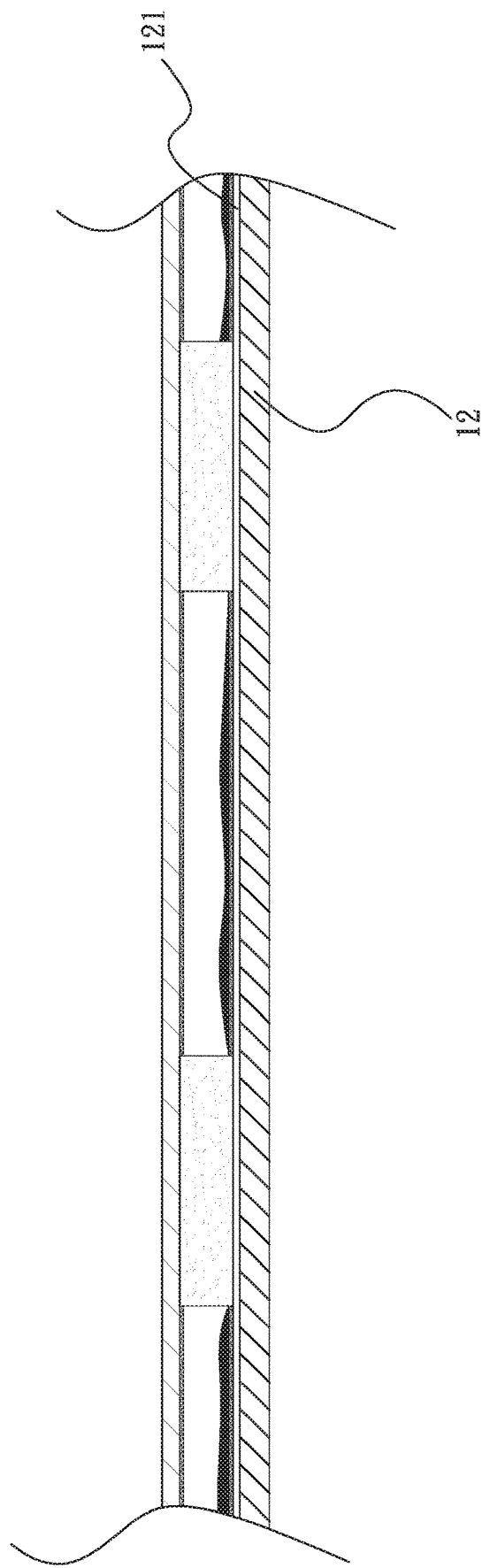
FIG. 5 is a cross sectional view of a vapor chamber structure according to a fourth embodiment of the present invention.

Please now refer to FIG. 5, which is a cross sectional view of a vapor chamber structure according to a fourth embodiment of the present invention. The fourth embodiment is partially identical to the first embodiment in structure and connection relationship and thus will not be redundantly described hereinafter. The fourth embodiment is different from the first embodiment in that multiple grooves 121 are formed on one face of the ceramic plate 12.

The present invention is characterized in that the ceramic plate 12 is used as one of two sides of the vapor chamber for contacting with a heat source to transfer heat. That is, one of two metal sides of the conventional vapor chamber is replaced by the ceramic plate 12 in the present invention. Since the ceramic plate 12 has a thermal expansion coefficient close to that of the ceramic packaging material of the heat source in an electronic device, it is able to avoid the problem of crack at an interface between the vapor chamber and the heat source due to thermal fatigue caused by different thermal expansion coefficients of the vapor chamber and the heat source. With one of two sides of the vapor chamber being made of a ceramic material, the vapor chamber as a heat dissipation device can be applied to more different fields.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A vapor chamber structure assembly comprising:
   a heat source packaged in a ceramic material;
   a main body formed of a metal plate and a ceramic plate correspondingly closed to each other to thereby together define a chamber therebetween;
   a support structure including a plurality of posts and/or hollow collar bodies formed on one face of the metal plate or one face of the ceramic plate to protrude toward and abut against one face of the other of the metal plate and the ceramic plate with the ceramic plate of the main body arranged in contact with the ceramic material of the heat source, wherein an outer surface of the plurality of posts and/or hollow collar bodies is formed with multiple grooves intersecting each other and all arranged nonparallel to an axial direction of the support structure;
   a working fluid; and
   a wick structure located on inner wall surfaces of the chamber.

2. The vapor chamber structure assembly as claimed in claim 1, wherein the wick structure is selected from the group consisting of a sintered powder structure, a netlike structure, and a plurality of grooves.

3. The vapor chamber structure assembly as claimed in claim 2, wherein the netlike structure is made of a material selected from a group consisting of copper, aluminum, stainless steel, commercial pure titanium and titanium alloy, in the case that the wick structure is a one-piece structure such as netlike body or sintered powder body, the wick structure being composed of multiple layers overlapped with each other, the wick structure being made of the same material or a combination of different materials.

4. The vapor chamber structure assembly as claimed in claim 1, wherein the ceramic plate is made of a material selected from the group consisting of silicon nitride ($Si_3N_4$), zirconium nitride ($ZrO_2$), and aluminum oxide ($Al_2O_3$) and wherein the wick structure includes multiple grooves formed on one face of the ceramic plate by way of laser processing or etching.

5. The vapor chamber structure assembly as claimed in claim 1, wherein the support structure is connected to the other of the metal plate and the ceramic plate in a manner selected from the group consisting of soldering, brazing, diffusion bonding, ultrasonic welding, and direct bonding copper (DBC) process.

6. The vapor chamber structure assembly as claimed in claim 1, wherein the support structure is formed on one face of the metal plate by way of punching processing to protrude toward the ceramic plate or by way of cutting processing as a protrusion structure to protrude toward the ceramic plate and abut against and support the ceramic plate.

7. The vapor chamber structure assembly as claimed in claim 1, wherein the support structure is made of a material selected from a group consisting of copper, aluminum, iron, stainless steel, ceramic material, commercial pure titanium, titanium alloy, copper alloy, and aluminum alloy.

8. The vapor chamber structure assembly as claimed in claim 1, wherein the metal plate is made of a material selected from the group consisting of a copper material, an aluminum material, a stainless steel material, commercial pure titanium, and titanium alloy.

9. The vapor chamber structure assembly as claimed in claim 1, wherein widths of two ends of the grooves are equal to each other.

10. The vapor chamber structure assembly of claim 1, wherein widths of two ends of the grooves are unequal to each other.

* * * * *